United States Patent
Zhang et al.

(10) Patent No.: US 10,477,716 B2
(45) Date of Patent: Nov. 12, 2019

(54) PORTABLE DISPLAY DEVICE

(71) Applicants: BOE TECHNOLOGY GROUP CO., LTD., Beijing (CN); BEIJING BOE MULTIMEDIA TECHNOLOGY CO., LTD., Beijing (CN)

(72) Inventors: Li Zhang, Beijing (CN); Cheng Zhang, Beijing (CN)

(73) Assignees: BOE TECHNOLOGY GROUP CO., LTD., Beijing (CN); BEIJING BOE MULTIMEDIA TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/429,495

(22) PCT Filed: Jun. 20, 2014

(86) PCT No.: PCT/CN2014/080438
§ 371 (c)(1),
(2) Date: Mar. 19, 2015

(87) PCT Pub. No.: WO2015/100966
PCT Pub. Date: Jul. 9, 2015

(65) Prior Publication Data
US 2016/0037672 A1 Feb. 4, 2016

(30) Foreign Application Priority Data

Dec. 30, 2013 (CN) .......................... 2013 1 0745140

(51) Int. Cl.
G06F 1/16 (2006.01)
H05K 7/14 (2006.01)
H04M 1/02 (2006.01)

(52) U.S. Cl.
CPC ......... H05K 7/1461 (2013.01); G06F 1/1613 (2013.01); G06F 1/1652 (2013.01);
(Continued)

(58) Field of Classification Search
None
See application file for complete search history.

(56) References Cited

U.S. PATENT DOCUMENTS 7,752,789 B2 * 7/2010 Sun .................. G06F 1/1601
108/70
7,848,091 B2 * 12/2010 Han .................. G06F 1/1616
361/679.26

(Continued)

FOREIGN PATENT DOCUMENTS

CN 1606317 A 4/2005
CN 1822672 A 8/2008

(Continued)

OTHER PUBLICATIONS

Second Chinese Office Action Appln. No. 201310745140; dated Oct. 10, 2015.

(Continued)

Primary Examiner — Courtney L Smith
Assistant Examiner — Rashen E Morrison
(74) Attorney, Agent, or Firm — Ladas & Parry LLP

(57) ABSTRACT

A portable display device includes a display element provided with a main screen thereon, the portable display device further includes a secondary screen capable of being incorporated with the main screen. By providing a secondary screen, a display region of the portable display device can be extended as required, thereby allowing to run more applications to satisfy user's demands. And at the same time, the drawing structure can extend the display region in a convenient and steady manner.

3 Claims, 2 Drawing Sheets

(52) U.S. Cl.
CPC ....... *H04M 1/0237* (2013.01); *H04M 1/0266* (2013.01); *H04M 2250/16* (2013.01)

(56) References Cited

U.S. PATENT DOCUMENTS

| | | | | |
|---|---|---|---|---|
| 7,864,514 | B2* | 1/2011 | Lee | F16M 11/046 248/602 |
| 7,952,866 | B2* | 5/2011 | Lee | G06F 1/1616 345/1.1 |
| 8,018,715 | B2* | 9/2011 | Chang | G06F 1/1616 248/917 |
| 8,379,377 | B2* | 2/2013 | Walters | G06F 1/1641 248/917 |
| 8,681,486 | B2* | 3/2014 | Singhal | G06F 1/1649 248/917 |
| 8,711,099 | B2* | 4/2014 | Wood | H04M 1/0235 345/169 |
| 8,723,890 | B2* | 5/2014 | Griffin | G06F 1/1624 345/649 |
| 8,842,425 | B2* | 9/2014 | Ryu | G06F 1/1601 361/679.21 |
| 9,030,379 | B2* | 5/2015 | Xu | G06F 1/1647 345/1.3 |
| 9,036,336 | B2* | 5/2015 | Yasumoto | B60K 35/00 340/425.5 |
| 2003/0232590 | A1* | 12/2003 | Okumura | B60H 1/00692 454/121 |
| 2005/0253775 | A1* | 11/2005 | Stewart | G06F 1/1616 345/1.1 |
| 2006/0082518 | A1* | 4/2006 | Ram | G06F 1/1601 345/1.1 |
| 2007/0247798 | A1 | 10/2007 | Scott, II | |
| 2007/0285343 | A1* | 12/2007 | Han | G06F 1/1616 345/1.3 |
| 2008/0134550 | A1* | 6/2008 | Sun | G06F 1/1601 40/491 |
| 2010/0124008 | A1* | 5/2010 | Chang | G06F 1/1616 361/679.26 |
| 2010/0265646 | A1* | 10/2010 | Lee | G06F 1/1616 361/679.09 |
| 2016/0077493 | A1* | 3/2016 | Wei | G06F 1/163 368/82 |

FOREIGN PATENT DOCUMENTS

| | | |
|---|---|---|
| CN | 201167350 Y | 12/2008 |
| CN | 101567921 A | 10/2009 |
| CN | 101969481 A | 2/2011 |
| CN | 101969485 A | 2/2011 |
| CN | 102799219 A | 11/2012 |
| JP | 2003-298700 A | 10/2003 |

OTHER PUBLICATIONS

First Chinese Office Action Appln. No. 201310745140.7; dated Jul. 13, 2015.
International Search Report Appln. No. PCT/CN2014/080438; dated Oct. 13, 2014.
Written Opinion of the International Searching Authority Appln. No. PCT/CN2014/080438; dated Oct. 13, 2014.

* cited by examiner

PORTABLE DISPLAY DEVICE

TECHNICAL FIELD

Embodiments of the present disclosure relates to a portable display device.

BACKGROUND

Nowadays, the portable display devices are getting more and more popular for its portability. A watch, especially an intellectual watch, already can run application software, and can achieve more functions, and can be used as a mobile electronics. However, for an intelligence watch, the screen thereof always has less area which makes it difficult to meet some of the consumer's demand, for example, watching movies, and etc., this has become a great drawback that restricts developments of the intelligence watches.

SUMMARY

In view of this, one of objects of the embodiment of the present disclosure is to provide a portable display device so that an area of a screen thereof can be extended.

At least one embodiment of the present disclosure provides a portable display device, which comprises a display element provided with a main screen thereon, and the portable display device further comprises a secondary screen which can be incorporated with the main screen to form a larger display region.

In one embodiment of the present disclosure, the display element is provided with a cavity therein for accommodating the secondary screen, and a side wall of the display element is provided with an opening communicating the cavity with the outside, through which the secondary screen can move from the inside to the outside of the cavity so as to incorporate with the main screen to form a larger display region.

In one embodiment of the present disclosure, the cavity is provided with one of a slide rail and a slide slot therein, the secondary screen is provided with the other of the slide rail and slide slot, and the slide rail cooperates with the slide slot, such that the secondary screen slides to the outside of the cavity by means of the slide slot and the slide rail.

In one embodiment of the present disclosure, an edge of the secondary screen parallel to its moving direction is provided with a frame on which the slide slot or slide rail is provided.

In one embodiment of the present disclosure, an elastic element is provided in the cavity and is arranged between the secondary screen and the bottom of the cavity and configured to support the secondary screen.

In one embodiment of the present disclosure, a bearing ball is provided on an upper end of the elastic element and is in contact with the bottom of the secondary screen.

In one embodiment of the present disclosure, the secondary screen comprises a display portion and a fixed portion, the fixed portion connecting with the display portion, and the display portion capable of moving to the outside of the cavity to incorporate with the main screen so as to form a large display region.

In one embodiment of the present disclosure, when the display portion moves outside of the cavity, a display plane of the display portion is at the same plane as the display plane of the main screen.

In one embodiment of the present disclosure, the inside of the secondary screen is provided with a pallet which can be engaged with the cavity to secure the secondary screen where the secondary screen moves to the outside of the cavity.

In one embodiment of the present disclosure, the outside of the secondary screen is provided with a lug, which is arranged outside of the opening and protrudes beyond the upper surface of the main screen.

The portable display device according to embodiments of the present disclosure is provided with a main screen and a secondary screen, and by incorporating the main screen with the secondary screen, the display region of the portable display device can be extended as required, thereby allowing to run more applications to satisfy user's requirement.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
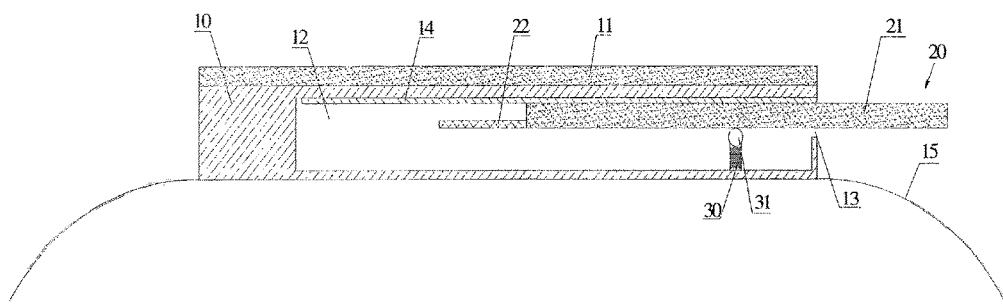
FIG. 1 is a schematic structural view of a portable display device according to one embodiment of the present disclosure.

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

At least one embodiment of the present disclosure provides a portable display device, as illustrated in FIGS. 1 to 4, the portable display device comprises a display element 10 provided with a main screen 11 thereon, and the portable display device further comprises a secondary screen 20 which can be incorporated with the main screen 11 to form a larger display region.

The secondary screen 20 can employ a flip structure, in which the secondary screen 20 is provided beside the main screen 11 or on the side wall of the display element 10, and when the secondary screen 20 needs to be used, the secondary screen 20 could be opened and be incorporated with the main screen 11 so as to form an incorporated display screen, or the secondary screen can adopt a folded structure, in which the main screen 11 is provided on the display element 10 and the secondary screen 20 is provided below the main screen 11, and when the secondary screen 20 needs to be used, the folded structure can be utilized to move away the main screen 11 and thus expose the secondary screen 20 and to incorporate the secondary screen 20 with the main screen 11 so as to form an incorporated display screen.

The portable display devices as described above can be a cell phone or an intelligence watch etc., the display element can be configured as a main body of the cell phone, or can be configured as a dial of the intelligence watch. When the portable display device is a watch (as illustrated in FIGS. 1 and 2), a flexible screen can be provided on the watch strap 15 as the secondary screen, and due to flexible characteristics of the flexible screen, the flexible screen can be provided on the watch strap as the secondary screen to incorporate with the main screen.

With the aforesaid structure, when a customer uses the portable display device, he can extend the display region of the portable display device as necessary by means of a secondary screen, while he can achieve the function described above through the main screen in normal operation. Thus, the aforesaid structure can extend the display region of the portable display device without affecting the normal operation of the portable display device, thus running more applications to meet with even more demands of the user. The main screen and secondary screen in the structures described above can be touch screens, and user can operate on the touch screens, and can control the displayed content on the main screen and the secondary screen by a controller provided in the portable display device.

Figure 2:
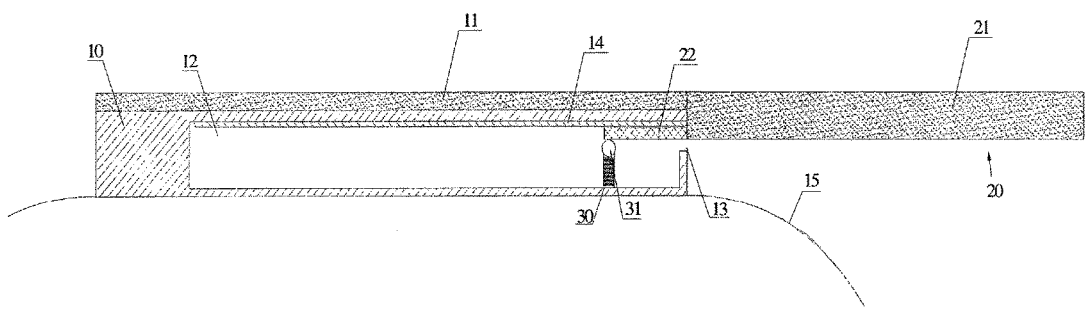
FIG. 2 is a schematic view illustrating the incorporation of a main screen and a secondary screen according to one embodiment of the present disclosure.

In one embodiment of the present disclosure, extension of the display screen of the portable display device is achieved in a drawing manner, as illustrated in FIGS. 1 and 2, a cavity 12 is provided in the display element 10, and the cavity 12 is designed to accommodate the secondary screen 20, when the portable display device is in normal operation, the secondary screen 20 is accommodated in the cavity 12. The side wall of the display element 10 is provided with an opening 13 to communicate the cavity 12 with the outside. When the display region is to be extended, the secondary screen 20 is moved from the inside to the outside of the cavity 12 through the opening 13, so as to incorporate with the main screen 11 to form an incorporated screen. The aforesaid structure allows a convenient extension of the display region of the portable display device, and when in normal operation, the aforesaid structure would not affect apparent structure of the portable display device, so that the portable display device occupies less space.

In one embodiment of the present disclosure, the cavity can be provided with one of a slide rail and a slide slot therein, and the secondary screen can be provided with the other of the slide rail and the slide slot thereon, and the slide rail cooperates with the slide slot so that the secondary screen can slide to the outside along the slide slot. For example, as illustrated in FIGS. 1 and 2, the slide rail 14 is provided within the cavity 12 as an individual component, or alternatively, the slide rail 14 can also be provided on the inner wall of the cavity 12, the slide slot 26 can be provided on the secondary screen 20. By the structure in which the slide rail 14 and the slide slot 26 cooperate with each other, the secondary screen 20 can move along the slide rail steadily, in such a way that the secondary screen 20 can move to the outside of the cavity 12 steadily and conveniently, thus the user could move the secondary screen 20 much more smoothly.

Figure 3:
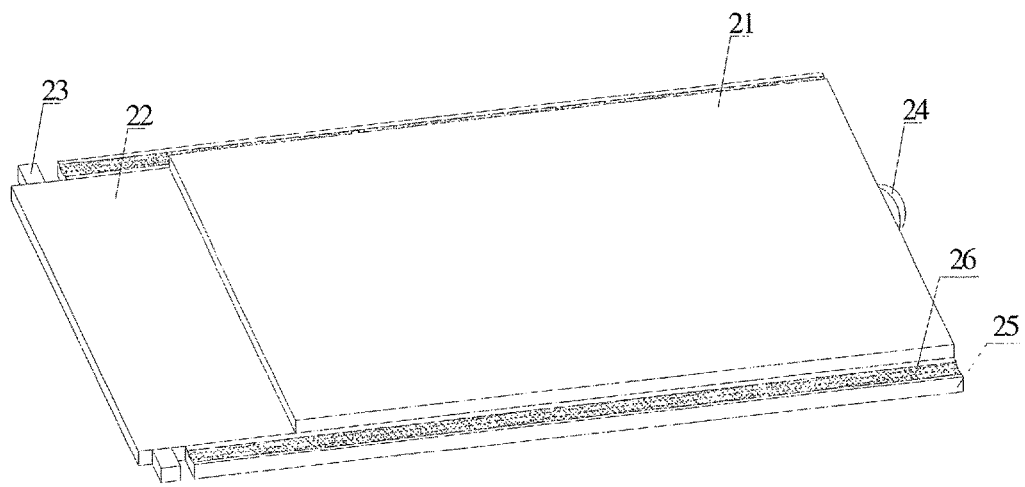
FIG. 3 is a schematic structural view of the secondary screen according to one embodiment of the present disclosure.

In one example, an edge of the secondary screen parallel with its moving direction is provided with a frame on which the slide slot or the slide rail is provided. For example, as illustrated in FIG. 3, a frame 25 can be provided so as to secure and protect the secondary screen 20, and at the same time, a slide slot 26 can be provided on the frame so as to facilitate the manufacturing process of the slide slot 26. It's to be understood that the frame 25 can be provided merely at two edges of the secondary screen 20 parallel to its moving direction, and can also be provided around all the peripheries of the secondary screen 20.

To be specified, in addition to the manners mentioned above, it's also possible to provide the slide rail on the secondary screen and provide the slide slot within the cavity, as long as the secondary screen could move to the outside of the cavity through the cooperation of the slide slot and slide rail, no restriction in this regard is set forth in the present disclosure.

Furthermore, as illustrated in FIGS. 1 and 2, the cavity 12 can be provided with an elastic element 30 therein, the elastic element 30 can be arranged between the secondary screen 20 and the bottom wall of the cavity 12, so as to support the secondary screen 20. With such a structure, it's possible to support the secondary screen steadily by the elastic element 30 when the secondary screen 20 moves outside of the cavity to incorporate with the main screen 11.

It should be noted that, the elastic element can be provided cooperatively with the above slide rail and the slide slot, so as to support the secondary screen steadily during the secondary screen sliding.

Still further, as illustrated in FIGS. 1 and 2, the secondary screen 20 comprises a display portion 21 and a fixed portion 22, wherein the display portion 21 can move to the outside of the cavity 12 through the opening 13, so as to incorporate with the main screen 11 to form a larger display region, the fixed portion 22 connects with the display portion 21. In the above structure, the display portion 21 is configured as an extendable screen, and the fixed portion 22 is configured to secure the display portion 21 where the display portion 21 moves to the outside of the cavity 12.

It should be noted that the display portion and the fixed portion can be provided cooperatively with an elastic element. As illustrated in FIGS. 1 and 2, where the display portion 21 moves to the outside of the cavity 12, the elastic element 30 supports the fixed portion 22 upwardly, such that the upper surface of the fixed portion 22 contacts with the top wall of the cavity 12, thereby the fixed portion 22 is secured by the elastic element 30 and the top wall of the cavity 12 and thus the display portion 21 is secured, when the secondary screen 20 is to be withdrawn into the cavity 12, the display portion 21 can be pressed down, the elastic element 30 contracts downwardly, then the display portion 21 can be pushed back into the cavity 12.

And furthermore, as illustrated in FIG. 2, when the display portion 21 moves to the outside of the cavity 12, the display plane of the display portion 21 is flush with the display plane of the main screen 11. For example, as illustrated in FIG. 3, the bottom side of the fixed portion is flush with the bottom side of the display portion 21, and a thickness of the fixed portion 22 can be less than that of the display portion 21, so, the secondary screen 20 can have a step structure composed of the fixed portion 22 and the display portion 21. As illustrated in FIG. 2, when the display portion 21 moves to the outside of the cavity 12 and the elastic element 30 supports the fixed portion 22 upwardly, the position of the display portion 21 outside of the cavity 12 would be raised. According to actual requirements, a thickness difference between the fixed portion 22 and the display portion 21 can be set as a preset value, in such a way that where the elastic element 30 supports the fixed portion 22 upwardly, the display plane of the display portion 21 is flush with the display plane of the main screen 11. Thus, the display region formed by incorporating the display portion 21 and the main screen 11 is a plane, the gap between the display portion 21 and the main screen 11 can also be reduced, thus it's easy for the user to watch and to touch and control.

Furthermore, the upper end of the elastic element 30 can be provided with a bearing ball 31, and the bearing ball 31 can contact with the bottom side of the secondary screen 20, wherein the bottom side of the secondary screen 20 is another side of the secondary screen 20 opposite to the display plane. With the above structure, a rolling contact can be formed between the secondary screen 20 and the elastic element 30, so that it's easy for the secondary screen 20 to move. It should be noted that the elastic element 30 can be configured as a component capable of applying an elastic force (for example, a spring, an elastic rubber block and etc.), there is no special requirement set forth on this regard in the present disclosure. Furthermore, in order to support the secondary screen 20 more steadily, a plurality of elastic elements 30 can be provided.

Furthermore, as illustrated in FIG. 3, the secondary screen 20 can be provided with a pallet 23 at the inside, the pallet 23 can be blocked in the cavity 12 to secure the secondary screen 20 when the secondary screen 20 moves to the outside of the cavity 12, wherein the inside of the secondary screen 20 refers to a side of the secondary screen 20 away from the opening 13 when the secondary screen 20 is located within the cavity 12. When the secondary screen 20 moves outside of the cavity 12, the pallet 23 can be blocked at both sides of the opening 13, thus it's possible to prevent the secondary screen 20 from moving outside of the cavity completely and falling off, or alternatively, it's also possible to provide a socket fitting with the pallet 23, so that when the secondary screen 20 moves to the preset position outside of the cavity 12, the pallet 23 can engage with the above socket and thus secure the secondary screen 20.

Figure 4:
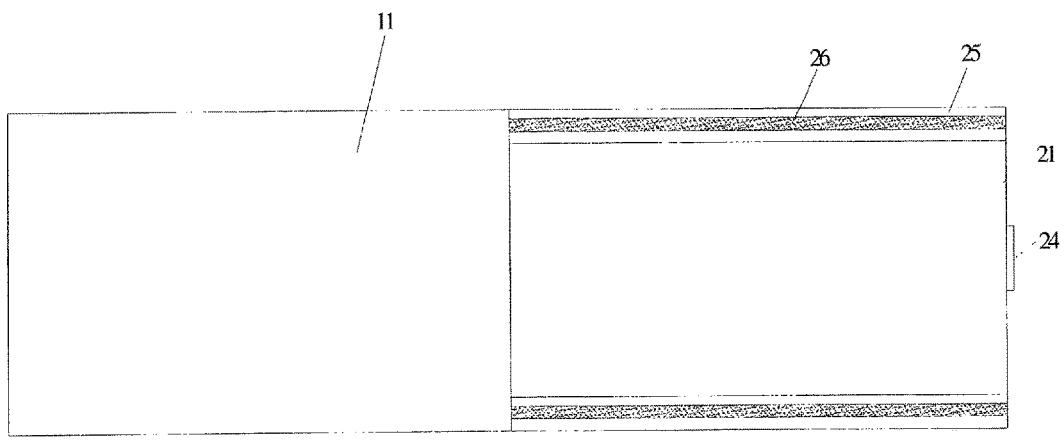
FIG. 4 is a top view illustrating the incorporation of a main screen and a secondary screen according to one embodiment of the present disclosure.

Furthermore, as illustrated in FIGS. 3 and 4, the outside of the secondary screen 20 can be provided with a lug 24, the lug 24 can be arranged outside of the opening 13 and protrude from the upper surface of the main screen 11, wherein the outside of the secondary screen 20 refers to the side of the secondary screen 20 close the opening 13 when the secondary screen 20 is accommodated within the cavity 12, the upper surface of the main screen 11 refers to the display plane of the main screen 11. For example, the lug 24 can be arranged outside of the opening 13 and be fixed to the outside of the secondary screen 20, and the lobe 24 can protrude beyond the main screen 11, in this way, when in use, the secondary screen 20 can be drawn out of the cavity 12 conveniently by means of the lug 24.

In the portable display device according to the above embodiments of the present disclosure, it's possible to arrange a circuit configuration corresponding to the main screen and secondary screen as well as a controller for controlling the main screen and secondary screen in the display element, and at the same time, it's also possible to provide interfaces on the display element configured to connect with external devices (for example, a computer, a charger etc.) and a loudspeaker for play back audios etc., the description thereof is omitted here.

It can be appreciated from the above description that, by providing a secondary screen, the display region of the portable display device (for example, an intelligence watch, a cell phone etc.) according to the embodiments of the present application can be extended as required, thereby allowing to run more applications so as to satisfy the user's requirement. And at the same time, the drawing structure provided by embodiments of the present disclosure could extend the display region in a convenient and steady manner.

The foregoing are merely exemplary embodiments of the disclosure, but are not used to limit the protection scope of the disclosure. The protection scope of the disclosure shall be defined by the attached claims.

The present application claims the priority of the Chinese patent application No. 201310745140.7 filed on Dec. 30, 2013, the disclosure of which is hereby entirely incorporated by reference.

The invention claimed is:

1. A portable display device comprising: a display element provided with a main screen thereon: the portable display device further comprising a secondary screen configured to be incorporated with the main screen; wherein, the display element is provided with a cavity below the main screen for accommodating the secondary screen, the cavity is provided with an elastic element arranged between a side of the secondary screen away from the main screen and a lower wall of the cavity, the cavity including one of a slide rail and a slide slot therein, the secondary screen is provided with the other of the slide rail and the slide slot; an upper end of the elastic element is provided with a bearing ball in contact with a bottom side of the secondary screen configured to support the secondary screen in a direction from the lower wall of the cavity to the main screen; a side wall of the display element is provided with an opening communicating the cavity through which the secondary screen moves from the inside to the outside of the cavity; wherein the secondary screen further comprising a display portion and a fixed portion, the fixed portion connects with the display portion, and the display portion moves to the outside of the cavity to incorporate with the main screen; and an inside of the secondary screen is further provided with a pallet engaging with the cavity to secure the secondary screen where the secondary screen moves to outside of the cavity, the cavity is provided with a socket fitting with the pallet, the pallet engages with the socket where the secondary screen moves to outside of the cavity; wherein, when the display portion is pressed down on the bearing ball, the elastic element contracts downwardly and the display portion is allowed to slide in and out of the cavity.

2. the portable display device according to claim 1, wherein where the display portion is incorporated with the main screen, a display plane of the display portion is flush with a display plane of the main screen.

3. the portable display device according to claim 1, wherein the outside of the secondary screen is provided with a lug, which is arranged outside of the opening and protrudes beyond the upper surface of the main screen.

* * * * *